United States Patent
Liu et al.

(10) Patent No.: US 11,050,416 B1
(45) Date of Patent: Jun. 29, 2021

(54) IMPLEMENTING PROCESS, VOLTAGE, AND/OR TEMPERATURE-INSENSITIVE RESISTANCE IN COMPLEMENTARY METAL-OXIDE-SEMICONDUCTORS USING A SHORT-DUTY-CLOCK CYCLE

(71) Applicant: INVENSENSE, INC., San Jose, CA (US)

(72) Inventors: Jialin Liu, Cornvallis, OR (US); Ming He, Fremont, CA (US); Richelle Smith, Los Altos, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 16/807,866

(22) Filed: Mar. 3, 2020

(51) Int. Cl.
*H03K 5/156* (2006.01)
*H03K 3/017* (2006.01)

(52) U.S. Cl.
CPC .......... *H03K 5/1565* (2013.01); *H03K 3/017* (2013.01)

(58) Field of Classification Search
None
See application file for complete search history.

(56) References Cited

U.S. PATENT DOCUMENTS

| | | | | |
|---|---|---|---|---|
| 5,923,028 A * | 7/1999 | Turnbull | ............... | B60Q 1/1423 250/214 R |
| 7,015,747 B2 * | 3/2006 | Kim | ..................... | H03H 19/008 327/311 |
| 9,882,570 B1 * | 1/2018 | Forey | .................... | H03K 5/1565 |
| 10,333,527 B2 * | 6/2019 | Forey | .................... | H03L 7/0807 |
| 10,673,204 B2 * | 6/2020 | Pavlov | .................. | G01S 7/4814 |

OTHER PUBLICATIONS

Perrott et al., "A Low Area, Switched-Resistor Based Franctional-N Synthesizer Applied to a MEMS-Based Programmable Oscillator" IEEE Journal of Solid-State Circuits, vol. 45, No. 12 pp. 2566-2581(Dec. 2010).
Perrott et al., "A Low Area, Switched-Resistor Loop-Filter Technique for Fractional-N Synthesizers Applied to a MEMS-Based Programmable Oscillator" ISSCC 2010, Session 13, Frequency & Clock Synthesis, 13.1. 2010 IEEE International Solid-State Circuits Conference. pp. 244-246.

* cited by examiner

*Primary Examiner* — Lincoln D Donovan
*Assistant Examiner* — Khareem E Almo
(74) *Attorney, Agent, or Firm* — Amin, Turocy & Watson, LLP

(57) ABSTRACT

Implementation of large temperature-insensitive resistance in CMOS using short-duty-clock cycle is provided herein. Operations of a method can comprise boosting a resistance level of a switched-resistor circuit to a defined resistance level. The boosting can comprise using a short-duty-cycle clock to facilitate the boosting. Also provided is a sensor system that can comprise a short-duty-cycle clock and a switched-resistor circuit. The short-duty cycle clock boosts a resistance level of the switched-resistor circuit to a defined resistance level.

16 Claims, 8 Drawing Sheets

US 11,050,416 B1

IMPLEMENTING PROCESS, VOLTAGE, AND/OR TEMPERATURE-INSENSITIVE RESISTANCE IN COMPLEMENTARY METAL-OXIDE-SEMICONDUCTORS USING A SHORT-DUTY-CLOCK CYCLE

TECHNICAL FIELD

This disclosure relates generally to the field of sensors and, more specifically, to a sensor interface circuit design that is insensitive to process, voltage, and/or temperature drift.

BACKGROUND

Electronic devices are ubiquitous, and users of such electronic devices generally demand instant access to, and flawless performance of, such devices. However, the structure of such devices can subject the devices to process, voltage, and/or temperature drift, which is a challenge that cannot be properly compensated in terms of sensor interface circuit design. Accordingly, unique challenges exist to provide a sensor interface circuit design for electronic devices that are insensitive to process, voltage, and/or temperature drift.

SUMMARY

The subject application relates to implementing large temperature-insensitive resistance in Complementary Metal-Oxide-Semiconductors (CMOS) using a short-duty-clock cycle. According to an embodiment, provided is a sensor system that can comprise a short-duty-cycle clock and a switched-resistor circuit. The short-duty cycle clock can boost a resistance level of the switched-resistor circuit to a defined resistance level.

According to some implementations, the sensor system also can comprise a temperature tracking clock generator that can retain a constant frequency value over a plurality of temperature values. In an example, the constant frequency value can improve an accuracy of a transfer function of the sensor system.

The short-duty-cycle clock can reduce a silicon area of the sensor system. Alternatively, or additionally, the short-duty-cycle clock can improve a linearity of the sensor system. In an alternative, or additional, implementation, the short-duty-cycle clock can mitigate respective variations associated with process, voltage, and/or temperature of the sensor system.

In some implementations, the short-duty-cycle clock can comprise a short-duty-cycle clock generator that can comprise a programmable resistor-capacitor delay unit comprising a plurality of resistors and a plurality of switches. The short-duty-cycle clock generator also can comprise a programmable resistor-capacitor delay unit comprising a plurality of resistors and a plurality of switches. Further, the short-duty-cycle clock generator can comprise a group of inverters and a NAND gate. The switched-resistor circuit can comprise a resistor and a set of switches. The resistor and the set of switches can be in a series configuration.

According to some implementations, the group of inverters can comprise a first inverter, a second inverter, and a third inverter. A first input node of the first inverter can be connected to an input signal and a first output node of the first inverter can be connected to respective input nodes of the programmable resistor-capacitor delay unit. A second input node of the second inverter can be connected to an output node of the programmable resistor-capacitor delay unit, and a second output node of the second inverter can be connected to a first input of the NAND gate. Further, a third input node of the third inverter can be connected to the input signal and a third output node of the third inverter can be connected to a second input of the NAND gate.

Further to the above implementations, the set of switches can comprise a first switch and a second switch located on opposite sides of the resistor in the series configuration. The short-duty-cycle clock generator can control the set of switches. In some implementations, the programmable resistor-capacitor delay unit can control a duty-cycle that can track a variation of a resistance of the resistor over temperature.

Also provided is a method that can comprise boosting a resistance level of a switched-resistor circuit to a defined resistance level. A short-duty-cycle clock can be utilized to facilitate the boosting. In some implementations, the method can comprise, prior to boosting the resistance level, operatively connecting the short-duty-cycle clock and the switched-resistor circuit.

In alternative, or additional, implementations, the method can comprise retaining a constant frequency value over a plurality of temperature values. Further to these implementations, the method can comprise improving an accuracy of a transfer function of a sensor system based on retaining the constant frequency value.

The method can comprise, according to some implementations, reducing a silicon area of a sensor system based on using the short-duty-cycle clock. In another example, the method can comprise improving a linearity of a sensor system based on using the short-duty-cycle clock. Further, the method can comprise mitigating respective variations associated with process, voltage, and/or temperature of the sensor system based on using the short-duty-cycle clock.

BRIEF DESCRIPTION OF THE DRAWINGS

Various non-limiting embodiments are further described with reference to the accompanying drawings in which.

DETAILED DESCRIPTION

One or more embodiments are now described more fully hereinafter with reference to the accompanying drawings in which example embodiments are shown. In the following description, for purposes of explanation, numerous specific details are set forth in order to provide a thorough understanding of the various embodiments.

In gyroscope sensor systems, accelerometer sensor systems, and/or other sensor systems, a capacitance-to-voltage (C2V) circuit can be critical to systematic performance of the sensor system. This is because the C2V circuit is the first stage directly interfacing the microelectromechanical systems (MEMS) sensors. The C2V circuit provides a band-pass transfer function for the signal from the sensor. Over temperature variation, the transfer function needs to be accurate in both phase and amplitude. While the gain is accurately set by capacitor ratio, the phase, which is set by the position of the corner frequencies of the transfer function, is dependent on temperature. To guarantee the phase accuracy, the high-pass corner frequency is pushed to a low frequency that is far away from the signal frequency. In addition, high sensitivity requirements on the C2V circuit determine the use of a small capacitor on the feedback path. These two reasons lead to the use of large resistance at the order of 100 giga Ohm. It is impractical to implement such a huge resistor in CMOS by using a polysilicon (poly) resistor.

Large resistance (or time constant) is often needed in sensor interface circuits for signal conditioning. However, implementing such a large time constant can be expensive in terms of silicon area. Traditional substitutions to large poly resistors, such as sub-threshold region-working Field Effect Transistor (FET) or switched-capacitor suffers from PVT (Process, Voltage and/or Temperature) variations, non-linearity, and/or noise penalty.

For example, there are two main existing solutions to avoid using an impractically large poly resistor. The first solution is to use sub-threshold-region working FET as a resistor. This topology introduces linearity, offset, and PVT variation problems. The second solution is to use switched capacitor as a resistor. However, the switched-capacitor suffers from noise-aliasing and charge injection.

The one or more aspects provided herein can facilitate enablement of use of regular size poly resistors to implement large equivalent resistance without running into the above noted challenges. In addition, the resistance can be temperature insensitive, which improves the performance of the sensor-interface circuit and, thus, the robustness of the entire system.

Figure 1:
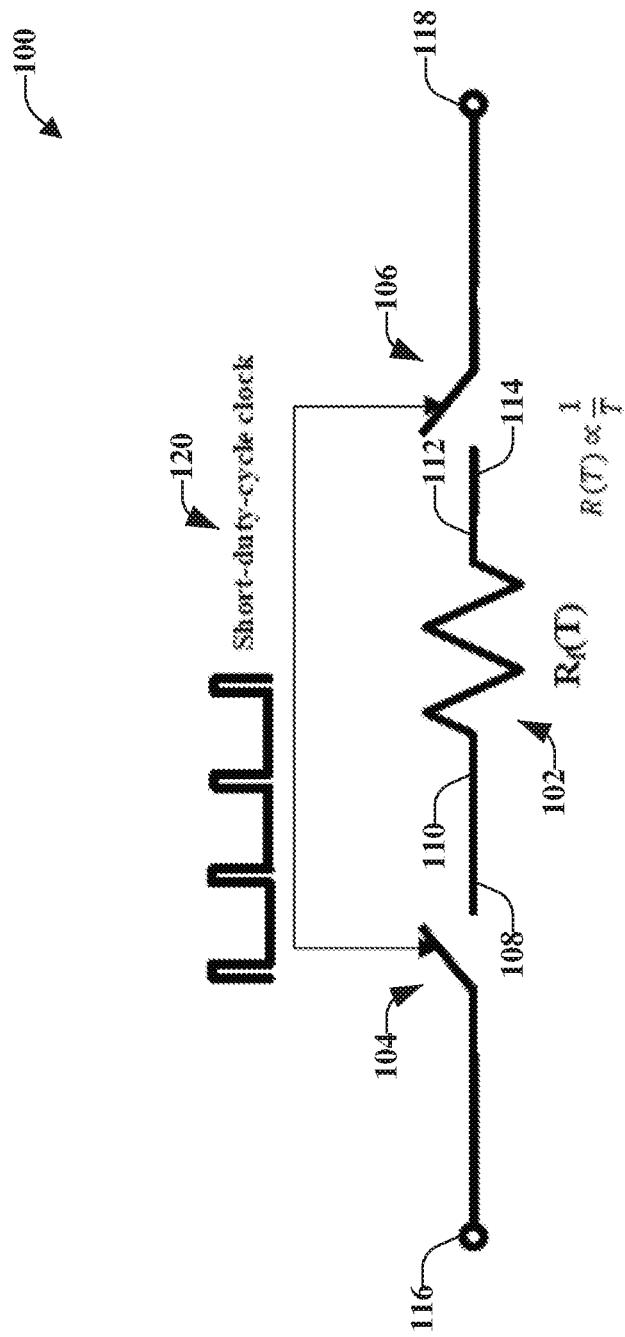
FIG. 1 illustrates an example, non-limiting, switched-resistor circuit in accordance with one or more embodiments described herein.

With reference initially to FIG. 1, illustrated is an example, non-limiting, switched-resistor circuit 100 in accordance with one or more embodiments described herein. It is noted that the switched-resistor circuit 100 comprises a structure that is for purposes of describing the various aspects and other structures can be utilized for the switched-resister circuit.

The switched-resistor circuit 100 can comprise a resistive element, such as a resistor 102. The resistor 102 can be, for example, a poly resistor. However, the disclosed aspects are not limited to this implementation and the resistor can be another type of resistor, or another type of resistive element.

The switched-resistor circuit 100 also can comprise a set of switches that are in a series configuration with the resistor 102. For example, a first switch 104 can be located on a first side of the resistor 102 and a second switch 106 can be located on a second side of the resistor 102. Accordingly, the switches (e.g., the first switch 104 and the second switch 106) are located on opposite sides of the resistor 102 in the series configuration.

In further detail, a first node 108 of the first switch 104 is operatively connected to a first node 110 of the resistor 102. A second node 112 of the resistor 102 is connected to a first node 114 of the second switch 106. Further, a second node 116 of the first switch 104 and a second node 118 of the second switch 106 can be operatively connected to respective components of a Resistor-Capacitor (RC) circuit, as will be discussed with respect to FIG. 3 and FIG. 4 below.

The set of switches (e.g., the first switch 104 and the second switch 106) can be controlled by a short duty-cycle clock 120. According to some implementations, the short duty-cycle clock 120 can comprise a very short duty cycle. For example, the set of switches can be turned on (or closed) for a very short period of time. Thus, the set of switches are off (or open) for a majority of the time. The pulse or waveform illustrates an output of the short-duty-cycle clock, which comprises short "on" periods and longer "off" periods.

In some cases, the equivalent resistance can be inverse proportional to the duty cycle of the clock:

$$R(T) \propto \frac{1}{T}$$

For example, if the switch is closed, the resistance can be expressed as $R_f(T)$. If the switch is open, there is an infinite resistance. Thus, within the same clock period (e.g., measured from the period that the switch is closed to the next instance that the switch is closed), the equivalent resistance will be very high. The resistance is scaled with the duty cycle. The shorter the duty cycle, the larger the equivalent resistance into this circuit.

Figure 2:
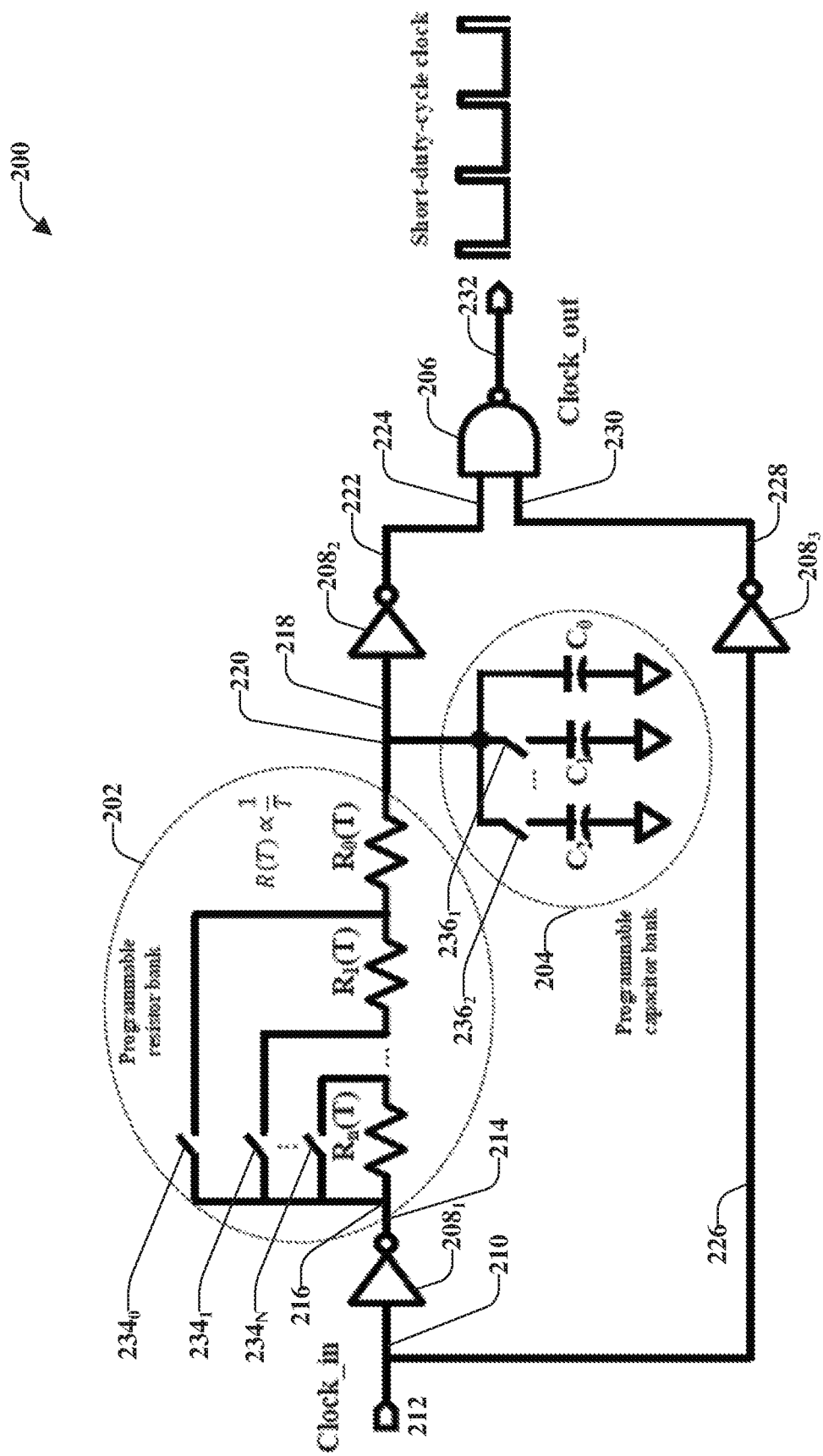
FIG. 2 illustrates an example, non-limiting, schematic representation of a short-duty-cycle clock generator circuit in accordance with one or more embodiments described herein.

FIG. 2 illustrates an example, non-limiting, schematic representation of a short-duty-cycle clock generator circuit 200 in accordance with one or more embodiments described herein. The short-duty-cycle clock generator circuit 200 can be for the switched-resistor circuit 100.

The short-duty-cycle clock generator circuit 200 can comprise a programmable resistor-capacitor delay unit comprising one or more resistors, which can be included in a resistor bank 202, and one or more capacitors, which can be included in a capacitor bank 204. According to various implementations, the resistor bank 202 can be a programmable resistor bank and/or the capacitor bank 204 can be a programmable capacitor bank. The resistor bank and the capacitor bank can be programmable in order to make the duty cycle programmable. If there is a particular equivalent resistance tracker desired, based on the resistor and capacitor values chosen in this structure, the pulse width needed to achieve a certain equivalent resistance can be determined.

The short-duty-cycle clock generator circuit 200 also can comprise a group of inverters and a NAND gate 206. The group of inverters can comprise a first inverter $208_1$, a second inverter $208_2$, and a third inverter $208_3$. The inverters can also be referred to as drivers. An input node 210 of the first inverter $208_1$ can be connected to an input signal 212 (e.g., clock_in). An output node 214 of the first inverter $208_1$ can be connected to an input node 216 of the programmable resistor-capacitor delay unit.

An input node 218 of the second inverter $208_2$ can be connected to an output node 220 of the programmable resistor-capacitor delay unit. Further, an output node 222 of the second inverter $208_2$ can be connected to an input node 224 of the NAND gate 206.

Further, an input node 226 of the third inverter $208_3$ can be connected to the input signal 212. An output node 228 of the third inverter $208_3$ can be connected to a second input 230 of the NAND gate 206. An output node of the NAND gate 206 can produce an output signal 232 (e.g., clock_out). The output signal 232 can be the short-duty-cycle clock, which can have the example waveform or pulse illustrated, or can have another waveform.

The resistor bank 202 can comprise one or more resistors, illustrated as a first resistor $R_0$, a second resistor $R_1$, through an Nth resistor $R_N$, where N is an integer. Also included in the resistor bank 202 can be one or more switches, illustrated as a first switch $234_0$, a second switch $234_1$, through an Nth switch $234_N$. The one or more switches can be operatively connected to the one or more resistors. For example, the first resistor $R_0$, can be operatively connected to the first switch $234_0$, the second resistor $R_0$, can be operatively connected to the second switch $234_1$, and the Nth resistor $R_N$, can be operatively connected to the Nth switch $234_N$.

The capacitor bank 204 can comprise one or more capacitors, illustrated as a first capacitor $C_0$, a second capacitor $C_1$, and a third capacitor $C_2$. Further, the capacitor bank 204 can comprise one or more switches. For example, a first switch $236_1$ can be connected to the second capacitor $C_1$ and a second switch $236_2$ can be connected to the third capacitor $C_1$. According to some implementations, another switch can be connected to the first capacitor $C_0$, although not illustrated.

The type of resistors and/or capacitors used for the switched-resistor circuit 100 of FIG. 1 and the short-duty-cycle clock generator circuit 200 of FIG. 2 can be a same type, a similar type, and/or different types.

According to some implementations, the short-duty-cycle clock generator circuit 200 of FIG. 2 can boost a resistance level of the switched-resistor circuit 100 to a defined resistance level. The resistance level can be defined based on the resistor and capacitor values chosen in the structure. In some implementations, the short-duty-cycle clock can reduce a silicon area of the sensor system. Alternatively, or additionally, the short-duty-cycle clock can improve a linearity of the sensor system. Further, the short-duty-cycle clock can mitigate respective variations associated with process, voltage, and temperature of the sensor system.

Figure 3:
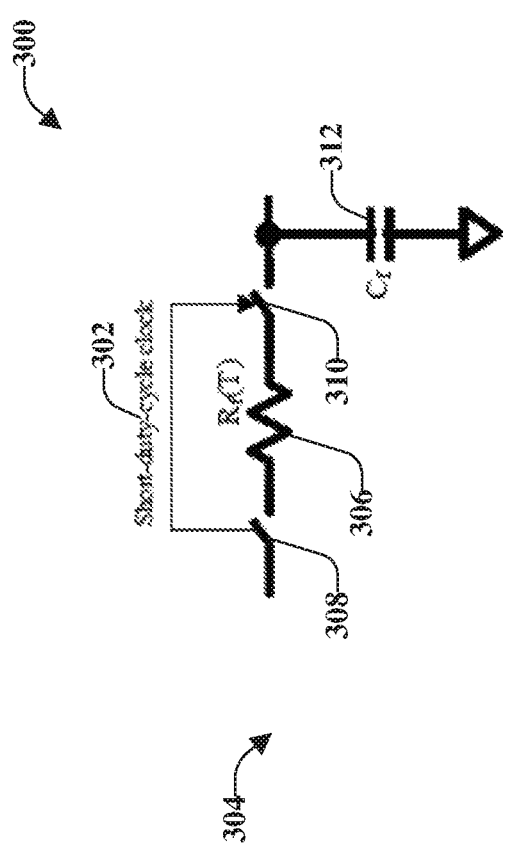
FIG. 3 illustrates an example, non-limiting, schematic representation of a sensor system circuit comprising a series resistor-capacitor configuration in accordance with one or more embodiments described herein.

FIG. 3 illustrates an example, non-limiting, schematic representation of a sensor system circuit 300 comprising a series resistor-capacitor configuration in accordance with one or more embodiments described herein.

As illustrated the sensor system circuit 300 can comprise a short-duty-cycle clock 302 and a switched-resistor circuit 304. The switched-resistor circuit 304 can comprise a resistor 306 (e.g., the first resistor $R_0$, the second resistor $R_1$, the Nth resistor $R_N$). Further, the switched-resistor circuit 304 can comprise a set of switches, illustrated as a first switch 308 (e.g., the first switch $234_0$, the second switch $234_1$, the Nth switch $134_N$) and a second switch 310 located on opposite sides of the resistor 306. The first switch 308, the resistor 306 and the second switch 310 are in a series configuration with one another. Also included in the sensor system circuit 300 is a capacitor 312 that is connected to ground.

Figure 4:
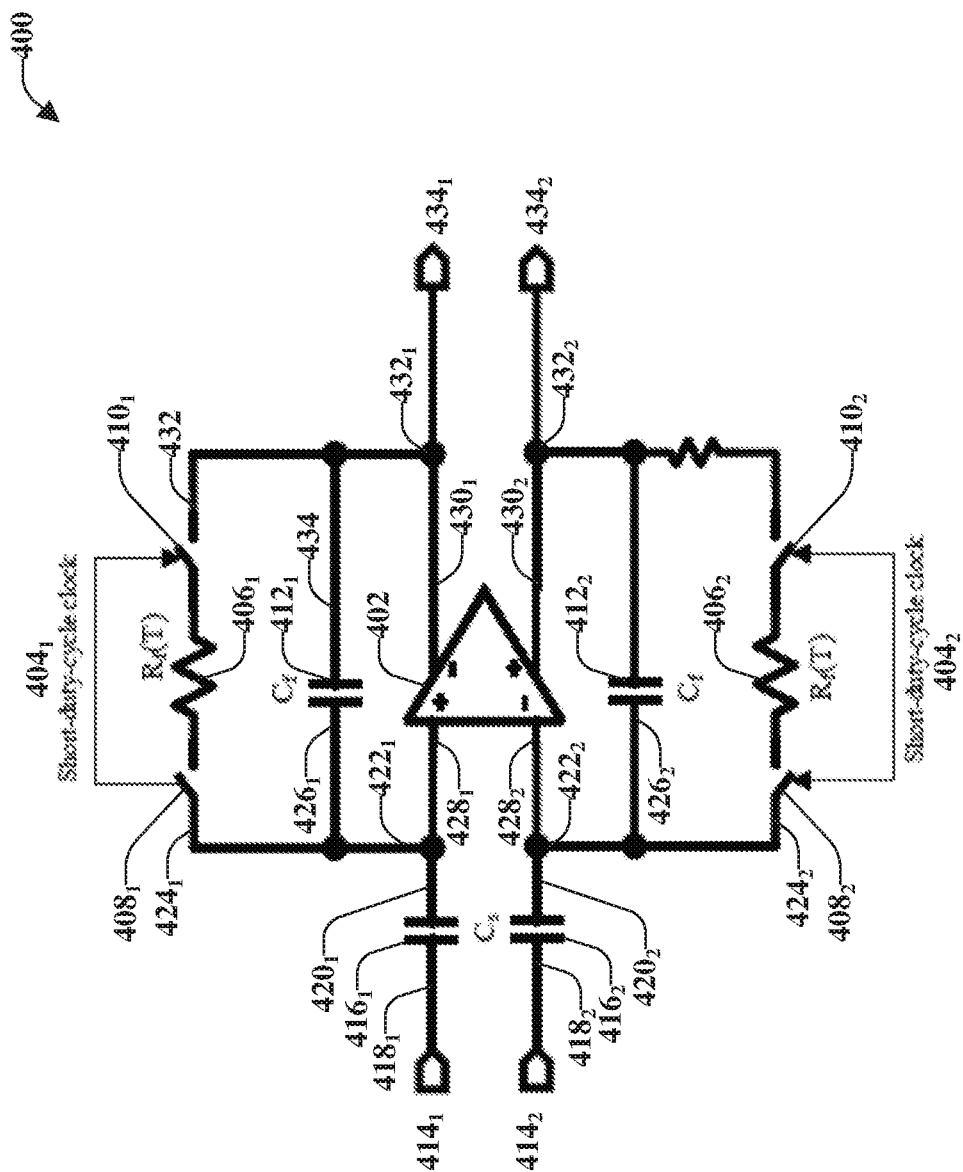
FIG. 4 illustrates an example, non-limiting, schematic representation of a sensor system circuit comprising a parallel resistor-capacitor configuration in accordance with one or more embodiments described herein.

FIG. 4 illustrates an example, non-limiting, schematic representation of a sensor system circuit 400 comprising a parallel resistor-capacitor configuration in accordance with one or more embodiments described herein. Repetitive description of like elements employed in other embodiments described herein is omitted for sake of brevity. It is noted that the sensor system circuit 400 of FIG. 4 is a generic sensor interface circuit design.

As illustrated the sensor system circuit 400 can comprise an operational amplifier 402 (e.g., amplifier) and parallel circuits. The parallel circuits can comprise respective short-duty-cycle clocks $404_1$ and $404_2$. Further, the parallel circuits can comprise respective resistors $406_1$ and $406_2$. The resistors $406_1$ and $406_2$ are in a series configuration with respective switches. For example, resistor $406_1$ is located between a first switch $408_1$ and a second switch $410_1$. Further, resistor $406_2$ and is located between a first switch $408_2$ and a second switch $410_2$. The resistors $406_1$ and $406_2$ are located in a parallel configuration with respective capacitors $412_1$ and $412_2$.

Respective input signals $414_1$ and $414_2$ can be received at respective capacitors $416_1$ and $416_2$. More specifically, the respective input signals $414_1$ and $414_2$ can be received at respective input nodes $418_1$ and $418_2$ of the respective capacitors $416_1$ and $416_2$. Respective output nodes $420_1$ and $420_2$ of the respective capacitors $416_1$ and $416_2$ can be operatively connected to respective inputs $422_1$ and $422_2$ of the parallel circuits. Thus, output node $420_1$ can be operatively connected to an input node $424_1$ of the resistor $406_1$ and an input node $426_1$ of the capacitor $412_1$. Further, output node $420_2$ can be operatively connected to an input node $424_2$ of the resistor $406_2$ and an input node $426_2$ of the capacitor $412_2$.

In addition, respective output nodes $420_1$ and $420_2$ of the respective capacitors $416_1$ and $416_2$ can be operatively connected to respective inputs $428_1$ and $428_2$ of the operational amplifier 402. Respective outputs $430_1$ and $430_2$ of the operational amplifier 402, and outputs $432_1$ and $432_2$ of the parallel circuits can provide respective output signals $434_1$ and $434_2$.

As discussed herein, the various aspects can comprise a short-duty-cycle clock generator and switched-resistor circuit. The short-duty-cycle clock generator can include a programmable RC delay unit, three inverters and one NAND gate. The switched-resistor circuit includes a resistor (e.g., resistive element) in series with two switches (one on each side of the resistor). The short-duty-cycle generator can generate the clock to control the switches in series with the resistor. The length of the duty-cycle can be set by the RC delay unit, which can be programmable. Further, the length of the duty-cycle can track the variation of the resistance of the switched-resistor over temperature. For example, when the temperature is higher, the resistance is lower. Since the duty-cycle is set by the RC delay unit, the duty-cycle is also shorter. The equivalent resistance of the switched-resistor is positively proportional to the resistance of the poly resistor, and inversely proportional to the length of the duty cycle. Overall, these two factors can cancel out each other and result in a temperature-insensitive equivalent resistance of the switched-resistor.

The switched-resistor can be functioning as a regular resistor for a signal whose frequency is much lower than the switching frequency, except that the equivalent resistance is amplified depending on the size of the duty cycle. For example, if the clock generated by the clock generator mentioned above has the duty-cycle of 0.01, then the resistance is amplified by a factor of 100. Further, the resistance is temperature-insensitive because of the reasons mentioned above.

For a gyroscope application, the clock used to generate the short-duty-cycle clock has the same initial phase as the carrier frequency of the amplitude-modulated (AM) signal from the MEMS sensor. Further, the frequency is doubled. By aligning the phase, the switched resistor always sees the zero-crossing point of the AM signal. This can further improve the linearity by reducing the harmonics of a carrier frequency seen at the output of the C2V circuit. Further, the doubled switching frequency avoids the aliasing.

Figure 5:
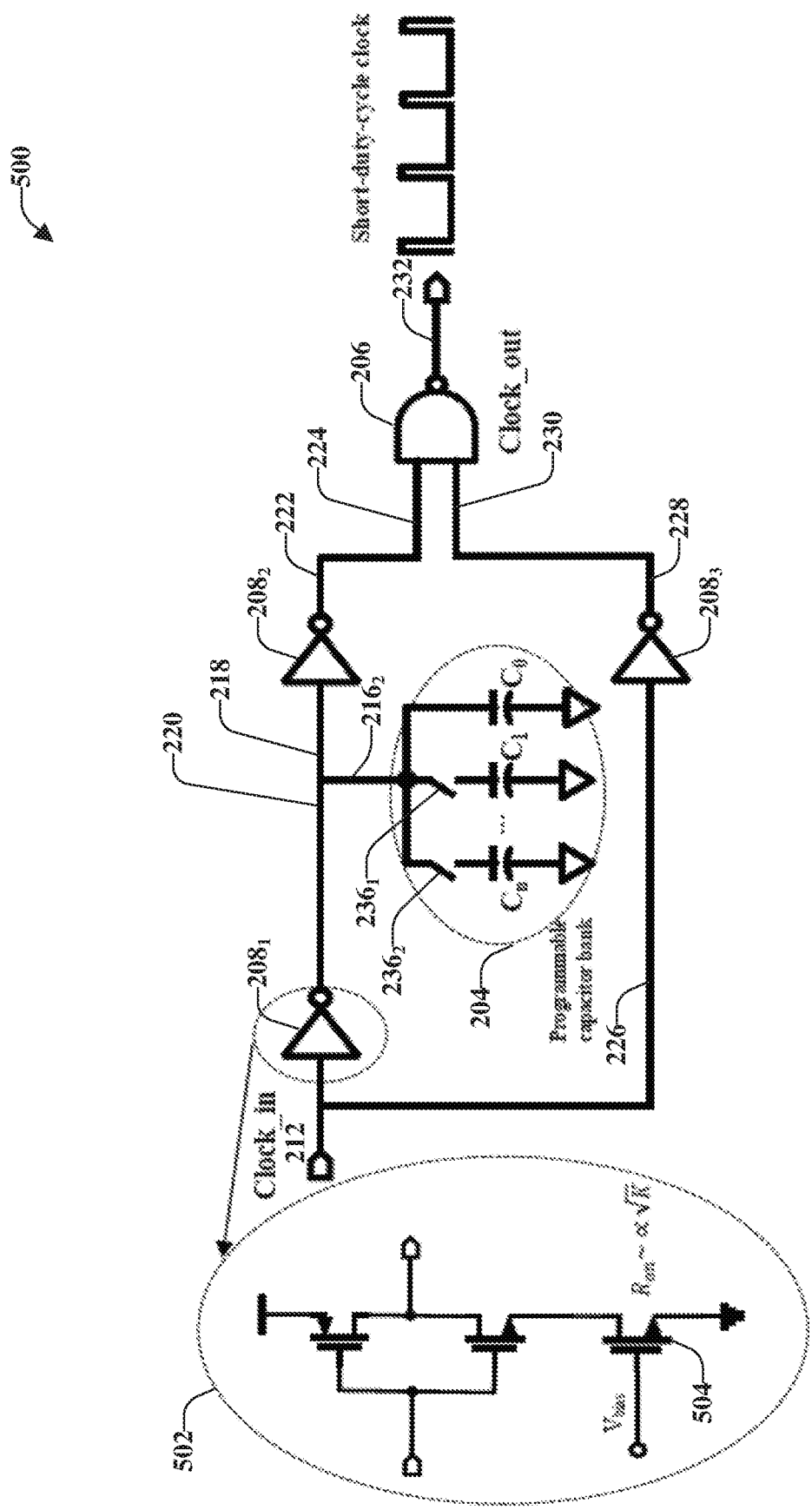
FIG. 5 illustrates another example, non-limiting, schematic representation of a short-duty-cycle clock generator circuit in accordance with one or more embodiments described herein.

FIG. 5 illustrates another example, non-limiting, schematic representation of a short-duty-cycle clock generator circuit 500 in accordance with one or more embodiments described herein. Repetitive description of like elements employed in other embodiments described herein is omitted for sake of brevity. The short-duty-cycle clock generator circuit 500 of FIG. 5 is similar to the short-duty-cycle clock generator circuit 200 of FIG. 2. However, in the case of FIG. 5, a MOSFET 502 is utilized instead of the resistor bank of FIG. 2.

Figure 6:
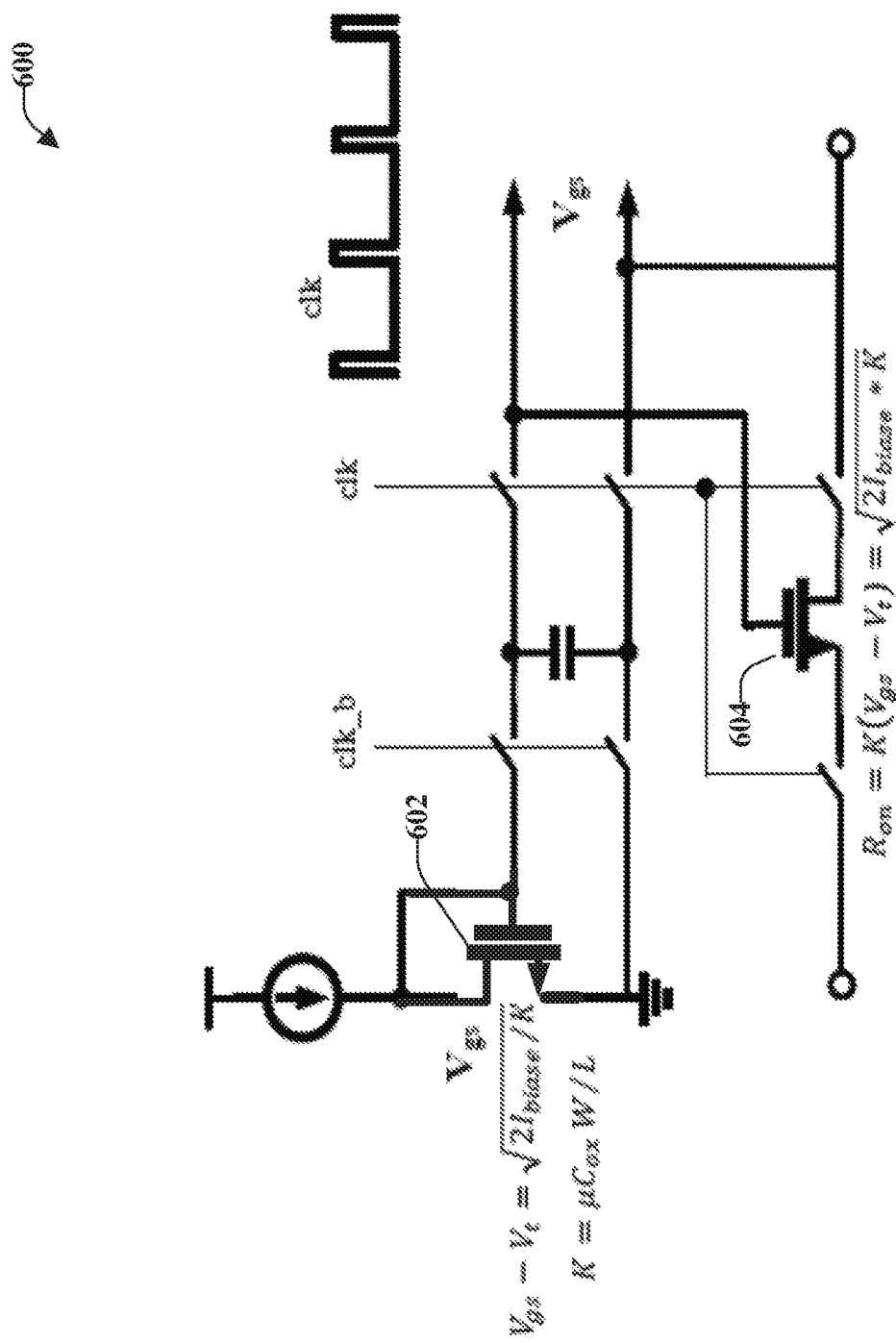
FIG. 6 illustrates an example, non-limiting, schematic representation of the switched-metal-oxide-semiconductor field-effect transistor (MOSFET) of FIG. 5 and its biasing in accordance with one or more embodiments described herein.

FIG. 6 illustrates an example, non-limiting, schematic representation 600 of the switched-MOSFET of FIG. 5 and its biasing in accordance with one or more embodiments described herein. Repetitive description of like elements employed in other embodiments described herein is omitted for sake of brevity.

It is noted that a transistor 504 of FIG. 5 and the first transistor 602 and second transistor 604 of FIG. 6 are matched transistors. Accordingly, the various aspects discussed with respect to the poly resistor can be applied using a MOSFET. As illustrated in FIG. 5 and FIG. 6, the poly resistor in the switched-resistor circuit can be replaced by MOSFET to further reduce the silicon area. The resistance boost due to the short-duty-cycle switching can enable the switched-MOSFET to work in a triode region. Compared to the MOSFET working in a sub-threshold region, triode-region MOSFET can be less sensitive to the PVT variation. Also, the second order distortion introduce by triode-region MOSFET can be attenuated by using a differential structure.

A proper biasing circuit can be designed to bias the MOSFET to cancel the threshold voltage variation. A short duty-cycle clock can be modified to track and cancel the mobility variation of the MOSFET over temperature. In total, the biasing circuit and short-duty cycle clock can result in a temperature-insensitive equivalent resistance.

For a gyroscope application, by closing the switch of the switched-MOSFET at the zero-crossing point of the AM signal, the signal swing seen by the MOSFET can be reduced and thus the linearity can be further improved.

Methods that can be implemented in accordance with the disclosed subject matter, will be better appreciated with reference to various flow charts. While, for purposes of simplicity of explanation, the methods are shown and described as a series of blocks, it is to be understood and appreciated that the disclosed aspects are not limited by the number or order of blocks, as some blocks can occur in different orders and/or at substantially the same time with other blocks from what is depicted and described herein. Moreover, not all illustrated blocks can be required to implement the disclosed methods. It is to be appreciated that the functionality associated with the blocks can be implemented by software, hardware, a combination thereof, or any other suitable means (e.g., device, system, process, component, and so forth). Additionally, it should be further appreciated that the disclosed methods are capable of being stored on an article of manufacture to facilitate transporting and transferring such methods to various devices. Those skilled in the art will understand and appreciate that the methods could alternatively be represented as a series of interrelated states or events, such as in a state diagram.

Figure 7:
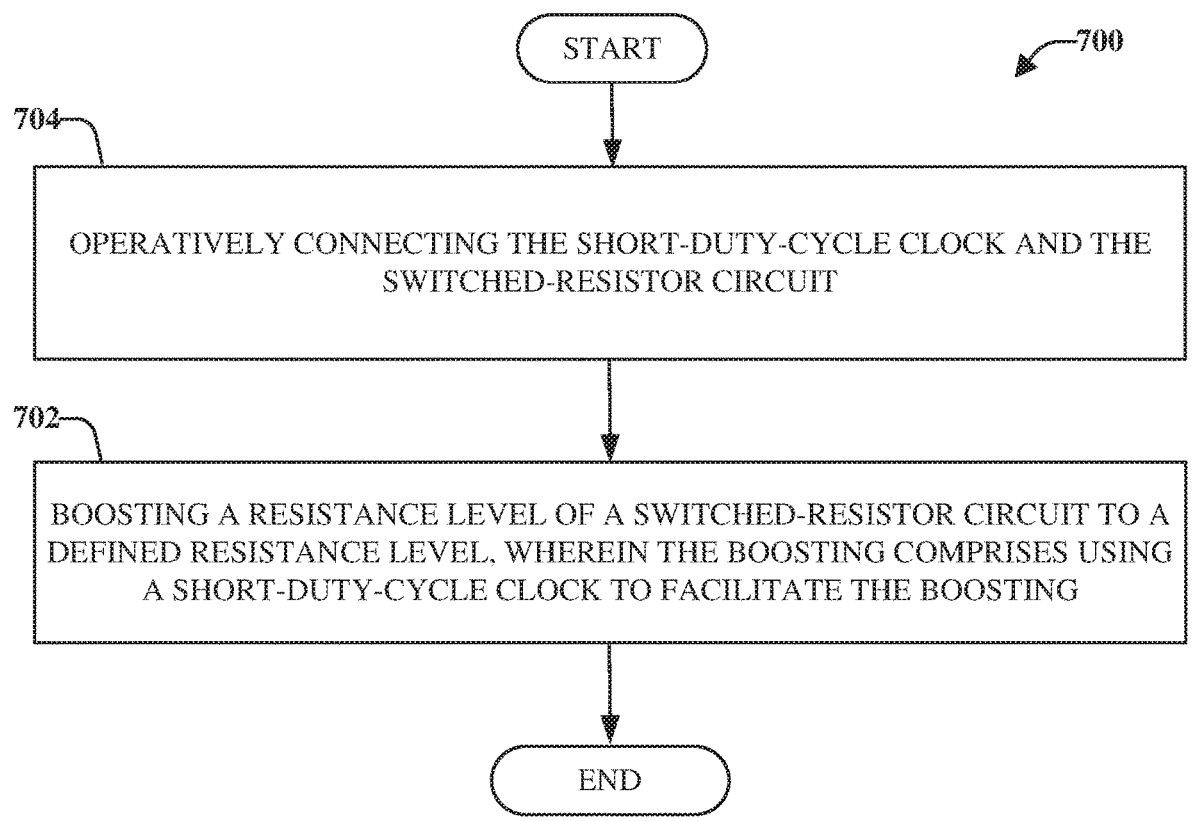
FIG. 7 illustrates a flow diagram of an example, non-limiting, method for facilitating implementation of a large temperature-insensitive time constant by using a temperature-tracking short-duty-cycle clock in accordance with one or more embodiments described herein.

FIG. 7 illustrates a flow diagram of an example, non-limiting, method 700 for facilitating implementation of a large temperature-insensitive time constant by using a temperature-tracking short-duty-cycle clock in accordance with one or more embodiments described herein.

The method 700 can include, at 702, boosting a resistance level of a switched-resistor circuit to a defined resistance level. Boosting the resistance level can comprise using a short-duty-cycle clock to facilitate the boosting. According to some implementations, the method 700 can include, prior to boosting the resistance level at 702, operatively connecting the short-duty-cycle clock and the switched-resistor circuit, at 704.

In an example, the method 700 can comprise retaining a constant frequency value over a plurality of temperature values. Further, the method can comprise improving an accuracy of a transfer function of a sensor system based on retaining the constant frequency value over the plurality of temperature values.

The method 700 can reduce a silicon area of a sensor system based on using the short-duty-cycle clock. Further, the method 700 can improve a linearity of a sensor system based on using the short-duty-cycle clock. Further, the method can mitigate respective variations associated with process, voltage, and temperature of the sensor system based on using the short-duty-cycle clock.

Figure 8:
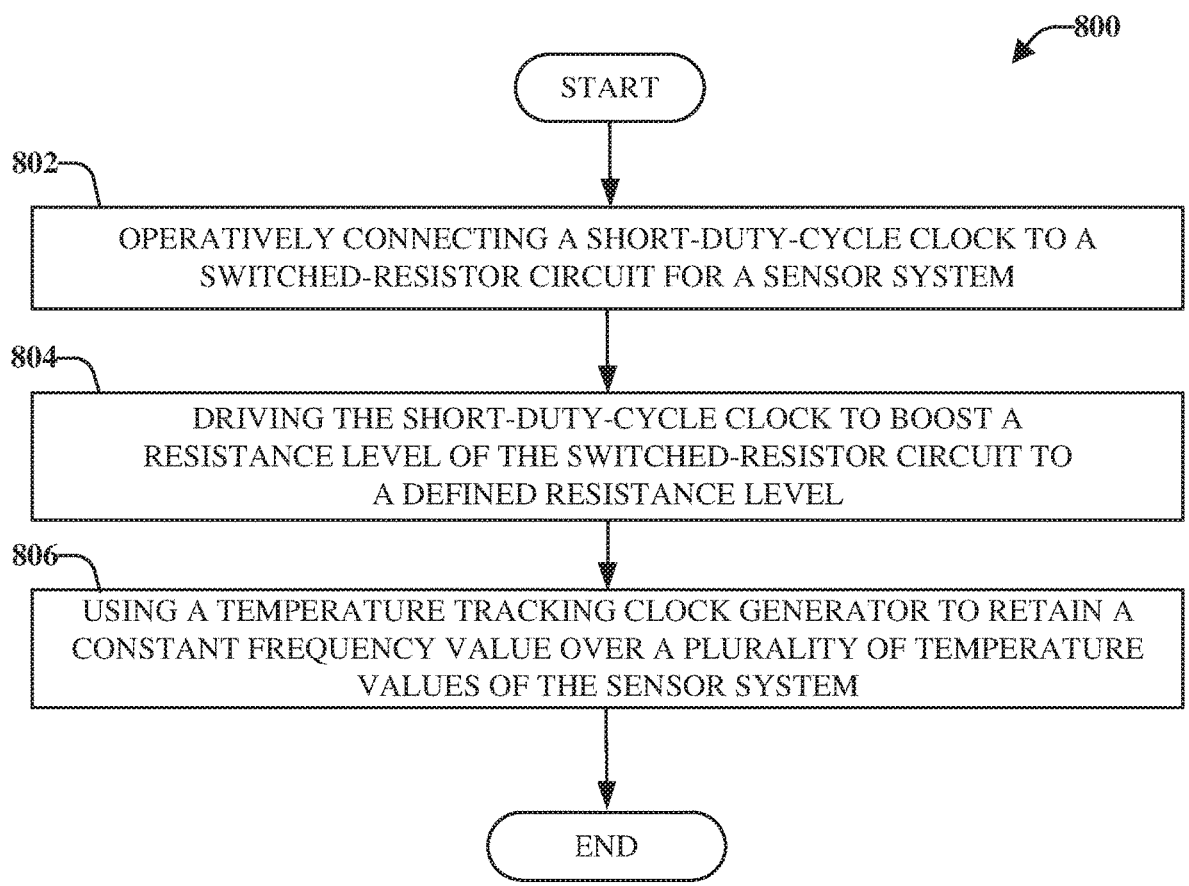
FIG. 8 illustrates a flow diagram of an example, non-limiting, method for fabricating a sensor system in accordance with one or more embodiments described herein.

FIG. 8 illustrates a flow diagram of an example, non-limiting, method 800 for fabricating a sensor system in accordance with one or more embodiments described herein.

At 802, a short-duty-cycle clock can be operatively connected to a switched-resistor circuit. At 804, the short-duty-cycle clock can be driven to boost a resistance level of the switched-resistor circuit to a defined resistance level. According to some implementations, the short-duty-cycle clock can reduce a silicon area of the sensor system. In some implementations, the short-duty-cycle clock can improve a linearity of the sensor system. In alternative, or additional, implementations, the short-duty cycle clock can clock mitigate respective variations associated with process, voltage, and temperature of the sensor system.

Alternatively, at 806, the method 800 can comprise using a temperature tracking clock generator to retain a constant frequency value over a plurality of temperature values of the sensor system. The constant frequency value can improve an accuracy of a transfer function of the sensor system.

According to some implementations, the method can comprise providing the short-duty-cycle clock, which can comprise a short-duty-cycle clock generator. Providing the short-duty-cycle clock generator can comprise providing a programmable resistor-capacitor delay unit comprising a plurality of resistors and a plurality of switches, a group of inverters, and a NAND gate. Further to these implementations, the method can comprise providing the switched-resistor circuit, which can comprise providing a resistor and a set of switches. The resistor and the set of switches can be in a series configuration.

Further to the above implementations, providing the group of inverters can comprise providing a first inverter, a second inverter, and a third inverter. Accordingly, the method can comprise operatively connecting a first input node of the first inverter to an input signal and a first output node of the first inverter to respective input nodes of the programmable resistor-capacitor delay unit. Further, the method can comprise operatively connecting a second input node of the second inverter to an output node of the programmable resistor-capacitor delay unit, and a second output node of the second inverter can be connected to a first input of the NAND gate. In addition, the method can comprise operatively connecting a third input node of the third inverter to the input signal and a third output node of the third inverter can be connected to a second input of the NAND gate.

In addition, according to the above implementations, providing the set of switches can comprise providing a first switch and a second switch located on opposite sides of the resistor (or another resistive element) in the series configuration.

As discussed herein, the disclosed aspects use a short-duty-cycle clock to boost up the equivalent resistance without using a large poly resistor or sub-threshold region MOSFET. By avoid using large poly resistor, the various aspects save the silicon area. By avoid using sub-threshold region MOSFET, the various aspects improve the linearity and reduces PVT variations.

Further, a temperature tracking clock generator can be used to keep the high-pass corner frequency constant over temperature variations. This can improve the accuracy of the overall transfer function of a C2V circuit. In a gyroscope application, by aligning the short-duty-cycle clock with the zero-crossing point of an AM signal, harmonic distortion can be reduced.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics can be combined in any suitable manner in one or more embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, the various embodiments can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, machine-readable device, computer-readable carrier, computer-readable media, machine-readable media, computer-readable (or machine-readable) storage/communication media. For example, computer-readable media can comprise, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media. Of course, those skilled in the art will recognize many modifications can be made to this configuration without departing from the scope or spirit of the various embodiments The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A sensor system, comprising:
   a short-duty-cycle clock; and
   a switched-resistor circuit, wherein the short-duty cycle clock boosts a resistance level of the switched-resistor circuit to a defined resistance level, and wherein the short-duty-cycle clock comprises a short-duty-cycle clock generator comprising:
      a programmable resistor-capacitor delay unit comprising a plurality of resistors and a plurality of switches,
      a group of inverters, and
      a NAND gate; and
   wherein the switched-resistor circuit comprises:
      a resistor, and
      a set of switches, wherein the resistor and the set of switches are in a series configuration.

2. The sensor system of claim 1, further comprising:
   a temperature tracking clock generator that retains a constant frequency value over a plurality of temperature values.

3. The sensor system of claim 2, wherein the constant frequency value improves an accuracy of a transfer function of the sensor system.

4. The sensor system of claim 1, wherein the short-duty-cycle clock reduces a silicon area of the sensor system.

5. The sensor system of claim 1, wherein the short-duty-cycle clock improves a linearity of the sensor system.

6. The sensor system of claim 1, wherein the short-duty-cycle clock mitigates respective variations associated with process, voltage, and temperature of the sensor system.

7. The sensor system of claim 1, wherein the group of inverters comprise a first inverter, a second inverter, and a third inverter, and wherein a first input node of the first inverter is connected to an input signal and a first output node of the first inverter is connected to respective input nodes of the programmable resistor-capacitor delay unit;

a second input node of the second inverter is connected to an output node of the programmable resistor-capacitor delay unit, and a second output node of the second inverter is connected to a first input of the NAND gate; and a third input node of the third inverter is connected to the input signal and a third output node of the third inverter is connected to a second input of the NAND gate.

8. The sensor system of claim 7, wherein the set of switches comprise a first switch and a second switch located on opposite sides of the resistor in the series configuration.

9. The sensor system of claim 7, wherein the short-duty-cycle clock generator controls the set of switches.

10. The sensor system of claim 7, wherein the programmable resistor-capacitor delay unit controls a duty-cycle that tracks a variation of a resistance of the resistor over temperature.

11. A method, comprising:

boosting a resistance level of a switched-resistor circuit to a defined resistance level, wherein the boosting comprises using a short-duty-cycle clock to facilitate the boosting, wherein the switched-resistor circuit comprises a resistor and a set of switches, wherein the resistor and the set of switches are in a series configuration; and retaining a constant frequency value over a plurality of temperature values.

12. The method of claim 11, further comprising:

prior to the boosting the resistance level, operatively connecting the short-duty-cycle clock and the switched-resistor circuit.

13. The method of claim 11, further comprising:

improving an accuracy of a transfer function of a sensor system based on the retaining.

14. The method of claim 11, further comprising:

reducing a silicon area of a sensor system based on the using the short-duty-cycle clock.

15. The method of claim 11, further comprising:

improving a linearity of a sensor system based on the using the short-duty-cycle clock.

16. The method of claim 11, further comprising:

mitigating respective variations associated with process, voltage, and temperature of a sensor system based on the using the short-duty-cycle clock.

* * * * *